· (12) United States Patent
Bae et al.

US008169012B2

(10) Patent No.: US 8,169,012 B2
(45) Date of Patent: May 1, 2012

(54) SEMICONDUCTOR DEVICE AND METHOD OF FABRICATING THE SEMICONDUCTOR DEVICE

(75) Inventors: Yong-kug Bae, Hwaseong-si (KR);
Si-hyeung Lee, Hwaseong-si (KR);
Tae-hyuk Ahn, Yongin-si (KR);
Seok-hwan Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 565 days.

(21) Appl. No.: 12/247,315

(22) Filed: Oct. 8, 2008

(65) Prior Publication Data
US 2009/0102017 A1 Apr. 23, 2009

(30) Foreign Application Priority Data

Oct. 23, 2007 (KR) .................. 10-2007-0106741

(51) Int. Cl.
*H01L 27/108* (2006.01)
*H01L 29/94* (2006.01)
(52) U.S. Cl. . 257/296; 257/300; 257/306; 257/E27.071; 257/E27.084; 257/E21.014
(58) Field of Classification Search ............. 257/296, 257/300, 306, 532, 535, E27.016, E27.024, 257/E27.044, E27.033, E27.048, E27.071, 257/E27.084, E21.008, E21.014, E21.648
See application file for complete search history.

(56) References Cited

U.S. PATENT DOCUMENTS

| 2006/0014344 A1* | 1/2006 | Manning | 438/243 |
| 2006/0261440 A1* | 11/2006 | Manning | 257/532 |
| 2008/0242042 A1* | 10/2008 | Kim et al. | 438/397 |

FOREIGN PATENT DOCUMENTS

| KR | 1020050025516 A | 3/2005 |
| KR | 1020050080670 A | 8/2005 |
| KR | 100716641 B1 | 5/2007 |

* cited by examiner

*Primary Examiner* — Minh-Loan T Tran
*Assistant Examiner* — Leslie Pilar Cruz
(74) *Attorney, Agent, or Firm* — Volentine & Whitt, PLLC

(57) ABSTRACT

A semiconductor device and a method of fabricating a semiconductor device provide high quality cylindrical capacitors. The semiconductor device includes a substrate defining a cell region and a peripheral circuit region, a plurality of capacitors in the cell region, and supports for supporting lower electrodes of the capacitors. The lower electrodes are disposed in a plurality of rows each extending in a first direction. A dielectric layer is disposed on the lower electrodes, and an upper electrode is disposed on the dielectric layer. The supports are in the form of stripes extending longitudinally in the first direction and spaced from each other along a second direction. Each of the supports engages the lower electrodes of a respective plurality of adjacent rows of the lower electrodes. Each one of the supports is also disposed at a different level in the device from the support that is adjacent thereto in the second direction.

14 Claims, 11 Drawing Sheets

SEMICONDUCTOR DEVICE AND METHOD OF FABRICATING THE SEMICONDUCTOR DEVICE

BACKGROUND OF THE INVENTION

1. Field of the Invention

The present invention relates to a semiconductor device and to a method of fabricating a semiconductor device. More particularly, the present invention relates to a semiconductor device having capacitors and to a method of fabricating capacitors of a semiconductor device.

2. Description of the Related Art

To meet the current demand for more compact electronics, the degree to which semiconductor devices, such as dynamic random access memories (DRAMs), are integrated is being increased so that the resulting semiconductor devices occupy smaller areas. However, the capacitance of a cell of a semiconductor device must be increased or, at a minimum, maintained, if the device is to minitiarized. Generally, techniques used to obtain sufficient cell capacitance within a limited area include a technique of forming a dielectric layer of the cell capacitor from a high-k dielectric material, techniques aimed at minimizing the thickness of the dielectric layer, and techniques aimed at maximizing the effective area of a lower electrode of the cell capacitor. The forming of a high-k dielectric layer requires dedicated processing equipment. Also, the reliability and productivity of the process of forming a high-k dielectric layer must be subsequently verified through additional processes. Furthermore, the fabrication processes which follow must be carried out at lower temperatures than normal. Thus, adopting this technique incurs costs associated with investing in new equipment, and costs associated with the long amount of time it takes to fabricate the devices. Therefore, techniques aimed at maximizing the effective area of the lower electrode of the cell capacitor have been more widely employed in developing new generations of semiconductor devices because they allow the dielectric layer to be fabricated in the same way as in the older generation devices.

Forming the lower electrode in the shape of a cylinder or pin, growing hemispherical grains (HSG) on the lower electrode, and maximizing the height of the lower electrode have all been used to increase the effective area of the lower electrode. However, it is difficult to obtain the desired critical dimension between lower electrodes formed by growing HSGs. Furthermore, the HSGs can delaminate. Therefore, when fabricating a semiconductor device having a design rule less than 0.14 μm, a bridge is likely to form between the lower electrodes. Therefore, the most widely used techniques for forming capacitors of semiconductor devices are those which form the lower electrodes of the capacitors in the shapes of solids and those which aim to maximize the height of the lower electrodes. In particular, techniques of forming the lower electrode in the shape of a cylinder or as a stack have been widely used to fabricate capacitors of semiconductor devices.

The effective area of a capacitor lower electrode, formed in the shape of a cylinder or as a stack, corresponds to the area of the outer surface of the electrode or the sum of the areas of the inner and outer surfaces of the electrode. Therefore, the effective area of such lower electrodes can be increased by making the structure of the lower electrodes taller. In this respect, attempts have been made to increase the height of a lower electrode having an integrated one-cylinder-stack (OCS) structure. However, tail lower electrodes having an integrated one-cylinder-stack (OCS) structure frequently collapse or are damaged before a dielectric layer of the capacitor is deposited thereon. The collapse or damage of the lower electrode is often caused by surface tension exerted on the lower electrode by a cleaning solution when the cleaning solution dries. The cleaning solution is used to clean the lower electrode after a mold layer, used to form the lower electrode, is wet-etched.

SUMMARY OF THE INVENTION

An object of the present invention is to provide a semiconductor device having high quality capacitors.

Another object of the present invention is to provide a semiconductor device having capacitors which provide high levels of capacitance.

Another object of the present invention is to provide a semiconductor device having highly integrated capacitors.

According to an aspect of the present invention, there is provided a semiconductor device including: a substrate on which a cell region and a peripheral circuit region are demarcated, a plurality of capacitors disposed in the cell region, and supports for lower electrodes of the capacitors, wherein the supports are disposed at different levels in the device and each support engages and supports a respective group of the lower electrodes. The lower electrodes preferably have a height of 10000-40000 Å, and all of the supports are preferably located at least 500 Å beneath (closer to the substrate than) upper ends of the lower electrodes.

According to another aspect of the present invention, the lower electrodes are arranged in rows each extending in a first direction, and the supports are a plurality of stripe-shaped supports spaced along a second direction perpendicular to the first direction. Each support simultaneously supports the lower electrodes of adjacent rows of lower electrodes. Preferably, each of the supports has a thickness of 100-5000 Å, and completely surrounds and engages (girds) all of the lower electrodes of adjacent rows of the lower electrodes.

Each of the supports also is disposed at a level different from that of the support adjacent thereto. Also, the lower electrodes of the adjacent rows may be arranged in a zigzag pattern along the first direction. That is, the lower electrodes in each of the rows are offset, in the second direction, from the lower electrodes in the row adjacent thereto. Preferably, the electrodes of alternate rows are aligned in groups in the second direction.

The supports may extend to an edge of the cell region that borders the peripheral circuit region. At least two or all the supports disposed at the same level in the device with respect to the substrate may be joined together at the edge of the cell region by a segment of the same material as the supports.

According to another aspect of the present invention, there is provided a method of fabricating a semiconductor device, the method including: providing a substrate on which a cell region and a peripheral circuit region are demarcated, forming on the substrate a plurality of support mold layers each including a mold layer and at least one support on the mold layer, forming a protective mold layer on the support mold layers, etching the support mold layers and the protective mold layer to form in the cell region a plurality of rows of holes passing through the supports of the mold layers, forming lower electrodes on inner walls delimiting the holes, respectively, to thereby form a plurality of rows of lower electrodes in the cell region, removing the mold layers and the protective mold layer, and forming a dielectric layer and an upper electrode on the lower electrodes The support mold layers are formed by forming a first mold layer on the substrate, forming a first support layer on the first mold layer, etching the first support layer to form a plurality of first stripe-shaped supports, forming a second mold layer on the first mold layer and the first supports, forming a second support layer on the second mold layer, and etching the second support layer to form a plurality of second stripe-shaped supports. The mold layers and the protective mold layer may be formed to a total thicknesses of 10000-40000 Å. Preferably, the first support and second support layers have a thickness of 100-5000 Å, respectively.

The lower electrodes may be formed by depositing conductive material on inner walls delimiting the holes and on an upper surface of the protective mold layer, forming a buried layer on the conductive layer, and planarizing the buried layer and the underlying conductive layer to expose the protective mold layer.

The mold layers and the protective mold layer may be removed (etched away) using fluorine or Limulus Amoebocyte Lysate (LAL).

According to still another aspect of the present invention, there is provided a method of fabricating a semiconductor device, the method including: providing a substrate on which a cell region and a peripheral circuit region are demarcated, forming a first mold layer on the substrate, forming a first support layer on the first mold layer, patterning the first support layer into at least one first stripe-shaped support extending longitudinally in a first direction in the cell region, forming a second mold layer on the first mold layer and each at least one first stripe-shaped support, forming a second support layer on the second mold layer, patterning the second support layer into at least one stripe-shaped second support, forming respective holes through each of the support layers in the cell region, forming lower electrodes on inner walls delimiting the holes, respectively, to thereby form a plurality of rows of lower electrodes, removing the mold layers, and forming a dielectric layer and an upper electrode on the lower electrodes. Each stripe-shaped second support is formed so as to extend longitudinally in the first direction in the cell region and so as to be offset, in a second direction perpendicular to the first direction, from each first stripe-shaped support. Thus, each second support is disposed at a level in the device different from that at which each first support is disposed.

BRIEF DESCRIPTION OF THE DRAWINGS

The above and other objects, features and advantages of the present invention will become more apparent from the following detailed description of the preferred embodiments thereof made with reference to the attached drawings in which:

FIGS. 3 through 11B illustrate a method of fabricating a semiconductor device according to the present invention, wherein FIGS. 4B, 6B, 7B, 8B, 9B, 10B, and 11B are sectional views taken along lines I-I' of FIGS. 4A, 6B, 7A, 8A, 9A, 10A, and 11A, respectively.

DETAILED DESCRIPTION OF THE PREFERRED EMBODIMENTS

Figure 1A:
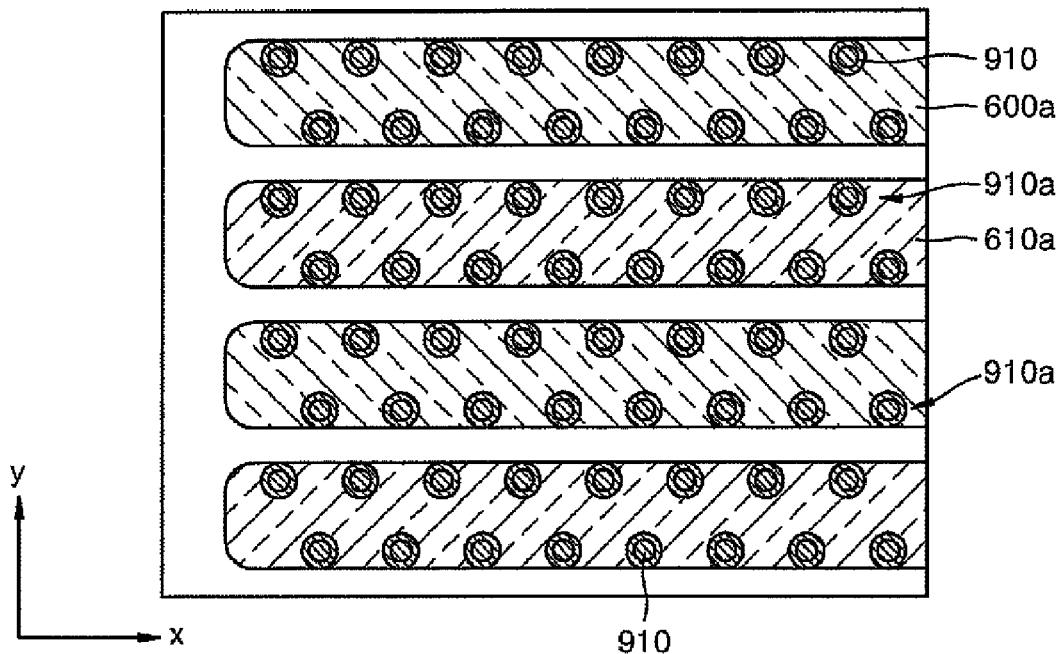
FIG. 1A is a plan view of a semiconductor device having cylindrical capacitors according to the present invention, illustrating lower electrodes of the capacitors and stripe-shaped supports supporting the lower electrodes.

The present invention will now be described more fully with reference to the accompanying drawings. Like reference numerals denote like elements throughout the drawings. Furthermore, the thicknesses of layers and regions are exaggerated in the drawings for clarity. Also, it will also be understood that when a layer is described as being disposed "on" another layer or substrate, such a description refers to both the case in which the layer being described is disposed directly on the other layer or substrate, and the case in which one or more layers is/are interposed therebetween.

Referring now to FIG. 1A, a semiconductor device having capacitors includes stripe-shaped supports 600a and 610a supporting lower electrodes 910 in a cell region on a substrate. The cell region may be generally rectangular. The lower electrodes 910 are arranged in a plurality of lower electrode rows 910a each extending in a first direction (an x-direction parallel to first sides of the cell region when the region is rectangular). That is, each of the lower electrode rows 910a includes a plurality of the lower electrodes 910 aligned and spaced apart in the first direction. Each of the stripe-shaped supports 600a and 610a extends between, completely surrounds and engages (girds), and thus supports a respective pair of adjacent rows 910a of the lower electrodes 910.

The stress, though, applied to the lower electrodes 910 by the supports 600a and 610a has minimal impact on the lower electrodes because the supports 600a and 610a are in the form of stripes, i.e., extend longitudinally in the first direction. That is, the stress is basically applied to the lower electrodes 910 only in the first direction. Furthermore, a lithographic process for patterning a layer to form the supports 600a and 610a is relatively easy to execute because the supports 600a and 610a have a simple geometric pattern, namely a striped pattern. That is, the mask for forming such a striped pattern is less complex and smaller than the mask necessary for forming a matrix. It is also easy to ensure the symmetry of the supports.

If, on the other hand, the supports were in the form of a matrix, the stress would be applied in several directions, causing the lower electrodes to twist and deform. Also, supports in the form of a matrix would require small gaps between the lower electrodes. In this case, it would be difficult to uniformly deposit material on the substrate after the electrodes were formed. If material deposited on the substrate had a non-uniform thickness, such material would cause a relatively large amount of stress to be exerted on the lower electrodes and thus, would exacerbate the problem of the twisting problem of the lower electrodes.

Referring once again to the present invention, the lower electrodes 910 of each row 910a may be offset from the lower electrodes 910 in the row 910a adjacent thereto to make the most of the space in which the lower electrodes 910 are provided. Therefore, the lower electrodes 910 of each adjacent pair of rows 910a are arrayed in a zigzag pattern along the first direction (x direction). Moreover, the lower electrodes 910 of every other row 910a (i.e., of alternating rows 910a) are aligned in a second direction (a y-direction) perpendicular to the first direction and hence, parallel to second sides of the cell region when the cell region is rectangular. In other words, every other row of the lower electrodes 910 (the alternate rows 910a) have groups of lower electrodes aligned in the y-direction.

Figure 1B:
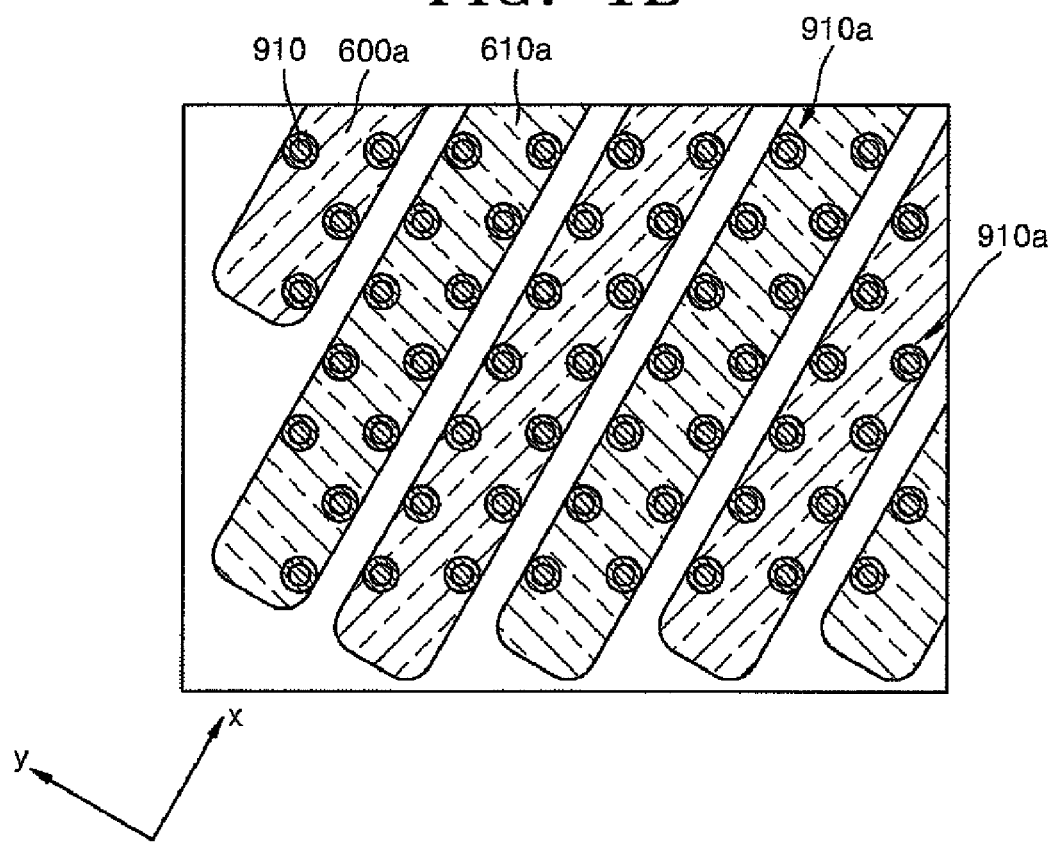
FIG. 1B is a plan view of a semiconductor device having cylindrical capacitors according to the present invention, illustrating another form of the lower electrodes and stripe-shaped supports.

FIG. 1B illustrates another form of the lower electrodes and stripe-shaped supports of a semiconductor device according to the present invention.

Referring to FIG. 1B, each of the lower electrode supports 600a and 610a extends longitudinally in an oblique direction, i.e., diagonally in the rectangular cell region of the semiconductor device. Thus, the layout of the rows 910a of lower electrodes 910 and lower electrode supports 600a and 610a is substantially the same as the layout shown in FIG. 1A when the oblique direction is regarded as the first direction (the x-direction). That is, this example is illustrated simply to show that the stripe-shaped supports 600a and 610a can extend in oblique directions in a rectangular cell region of the semiconductor device. This embodiment helps to minimize the space required between lower electrodes 910 and to facilitate the symmetry of the structure upon the subsequent deposition of additional materials.

Still referring to FIGS. 1A and 1B, although not readily apparent, the first and second supports 600a and 610a are disposed at different levels with respect to the substrate. If the first and second supports 600a and 610a were formed at the same level on the substrate, the first and second supports 600a and 610a would have to be very narrow so that they could be spaced apart (in the y direction) within the margin allowed for by the lithographic process used to form the supports. In that case, each of the first and second supports 600a and 610a would not be able to surround, and thereby offer maximum support to, all of the lower electrodes 910 associated therewith.

On the other hand, according to this embodiment of the present invention, each of the first and second supports 600a and 610a surrounds all of the lower electrodes 910 in a pair of adjacent rows 910a thereof. For example, the first supports 600a are disposed at the same level (i.e., at a first height) above the substrate. Also, each first support 600a has a width that is same as the sum of the distance between adjacent rows 910a of the lower electrodes 910 and twice the width (outer diameter) of a lower electrode 910. In this case, the distance between the adjacent first supports 600a is greater than the width of a first support 600a. Thus, the pattern of the first supports 600a can be easily formed using a lithographic process.

The second supports 610a may be formed at a second height, different from the first height, above the substrate. Also, each second support 610a has a width that is same as the sum of the distance between adjacent rows 910a of the lower electrodes 910 and twice the width (outer diameter) of a lower electrode 910. In this case, as well, the distance between adjacent second supports 610a is greater than the width of a second support 610a. Thus, the pattern of the second supports 610a can also be easily formed using a lithographic process.

Moreover, the first and second supports 600a and 610a each encircle or otherwise substantially surround and engage all of the lower electrodes 910 of an adjacent pair of rows 910a of the lower electrodes. Accordingly, the first and second supports 600a and 610a can most effectively prevent the lower electrodes 910 from collapsing during the fabrication process. Note, the lower electrodes 910 supported by the first supports 600a are not supported by the second supports 610a, and the lower electrodes 910 supported by the second supports 600a are not supported by the first support 600a. Thus, the widths of the first and second supports 600a and 610a are limited.

The lower electrodes 910 occupy holes that are formed by etching the first and second supports 600a and 610a and mold layers. If, contrary to the present invention, the first and second supports 600a and 610a were to only extend around part of the lower electrodes, it would be difficult to form the holes for the lower electrodes in proper registry with the first and second supports 600a and 610a. That is, the extent to which the holes would be encompassed by the first and second supports 600a and 610a would vary. The variation would be particularly great in a semiconductor device having a minute design rule. However, according to the present invention in which the first and second supports 600a and 610a are formed at different levels, i.e., at different heights above the substrate, the holes will have identical sizes and thus the first and second supports 600a and 610a will surround all of the lower electrodes 910 to the same extent (completely).

Figure 2:
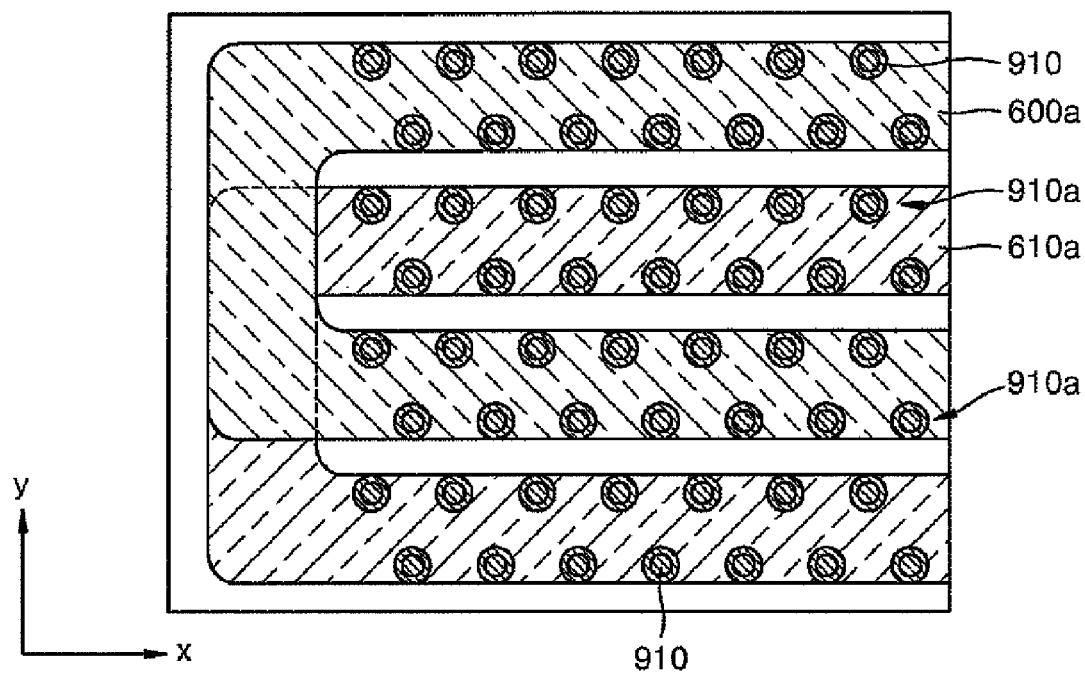
FIG. 2 is a plan view of a semiconductor device having cylindrical capacitors according to the present invention, illustrating still another form of the lower electrodes and stripe-shaped supports.

FIG. 2 illustrates another arrangement of the lower electrodes and stripe-shaped supports of a semiconductor device according to the present invention.

Referring to FIG. 2, the first and second supports 600a and 610a extend to the edge of the cell to prevent the supports from being decomposed during a wet-etching process (described later on). Two first supports 600a are adjoined at the edge of the cell. Likewise, two second supports 610a are adjoined at the edge of the cell. However, the present invention is not so limited. For example, three or more first supports 600a may be adjoined at the edge of the cell. Furthermore, only some or all of the first supports 600a may be adjoined at the edge of the cell. Likewise, three or more second supports 610a may be adjoined at the edge of the cell, and only some or all the second supports 610a may be adjoined at the edge of the cell.

A method of fabricating a semiconductor device according to the present invention will now be described with reference to FIGS. 3 through 11B.

Figure 3:
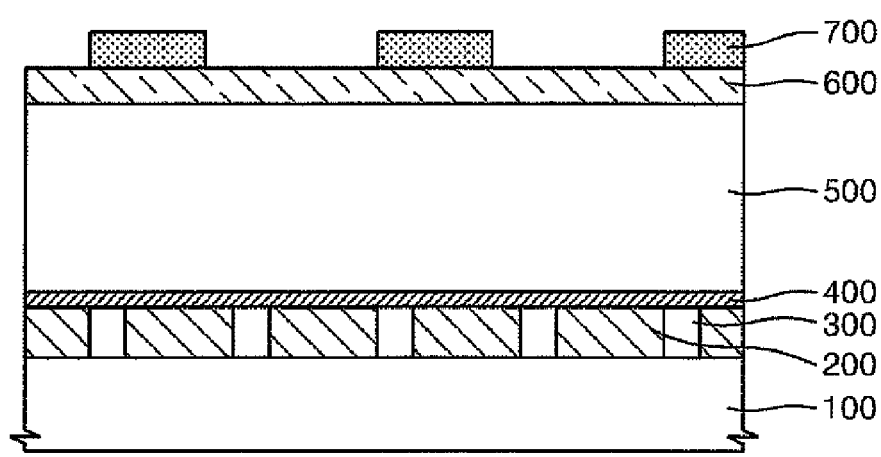

Referring first to FIG. 3, a mold layer 500 is formed on an interlayer dielectric 200 disposed on a substrate 100. The interlayer dielectric 200 is, in turn, disposed above a layer of contact plugs 300, and an anti-etching layer 400 formed on the substrate 100. A first support layer 600 is formed on the first mold layer 500. The first support layer 600 preferably has a thickness of 100-5000 Å. A first mask 700 is formed on the first support layer 600. The first mask 700 is, for example, a photoresist pattern. The first mask 700 may be formed on a cell region of the device and may extend to the edge of the cell region, e.g., to a boundary between the cell region and the peripheral circuit region. The first mask 700 has a pattern corresponding to that of the first lower electrode supports 600a. For example, the first mask 700 may have a pattern of stripes extending longitudinally in a first direction (an x-direction).

The stripes (lines) of the pattern of the first mask 700 are designed such that each stripe will span, widthwise, a first pair of adjacent rows of lower electrodes formed by a subsequently executed process. However, the pattern of the first mask 700 is designed so that the stripes do not extend, in their widthwise direction, to locations over a row or rows of lower electrodes adjacent the first pair in the second direction (y direction). In particular, the first mask pattern 700 defines a space directly over the location where a second pair of adjacent rows of lower electrodes will be formed adjacent to the first pair in the second direction. Therefore, the first mask 700 can be easily formed because the margin for the process of forming such a line and space pattern of the first mask 700 is much greater than the minimum process margin of typical lithographic processes carried out in the forming of other patterns in a semiconductor device.

Figure 4A:
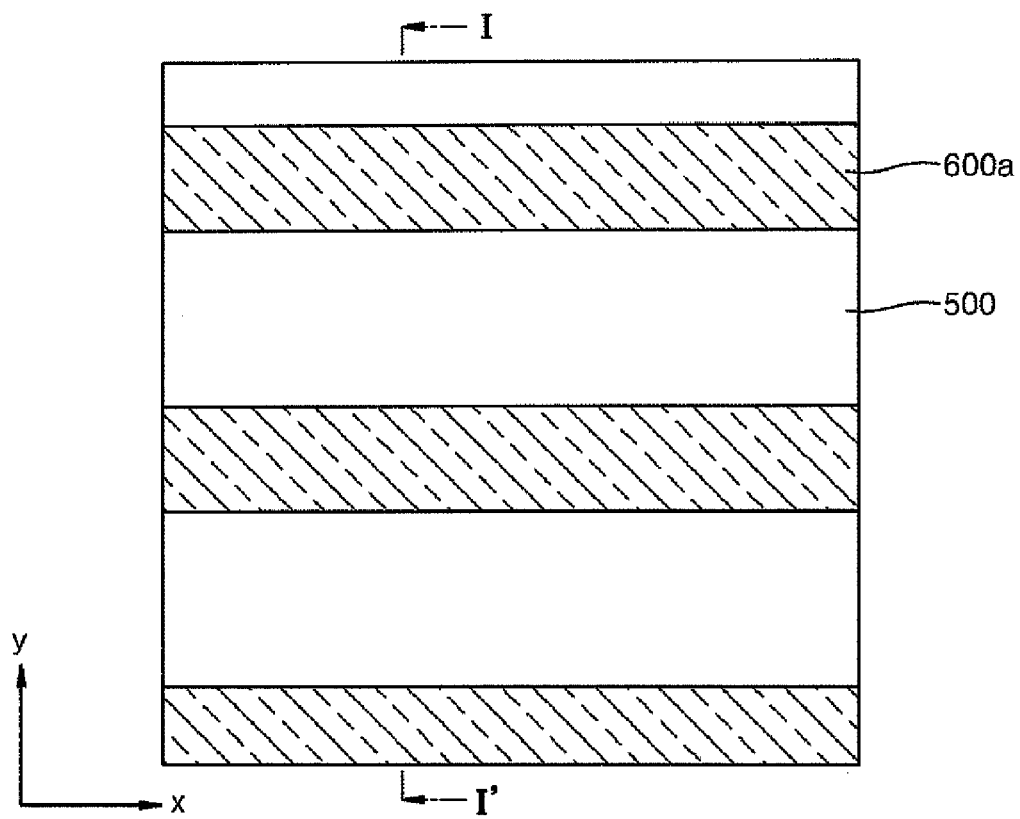
FIGS. 4A, 6B, 7A, 8A, 9A, 10A, and 11A are plan views.
Figure 4B:
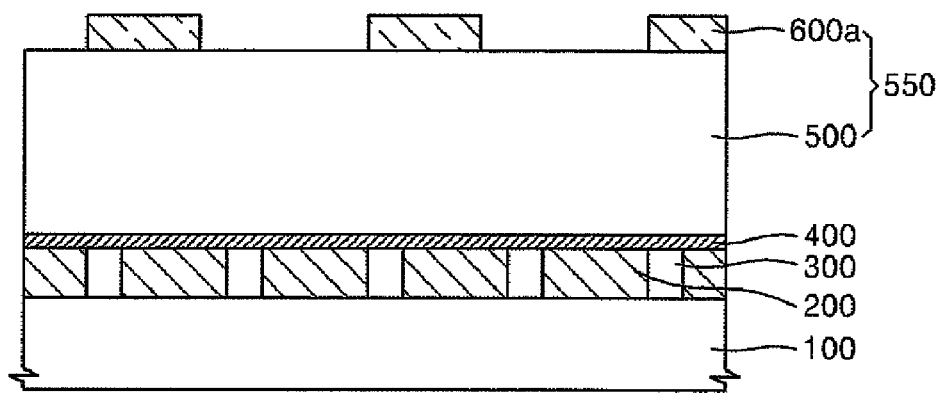

Referring to FIGS. 4A and 4B, the first support layer 600 is dry-etched using the first mask 700 as an etch mask. As a result, first supports 600a in the form of stripes are formed, and the first mold layer 500 is exposed between first supports

600a. Note, reference numeral 550 denotes a first support mold layer comprising the first mold layer 500 and the first supports 600a.

Figure 5:
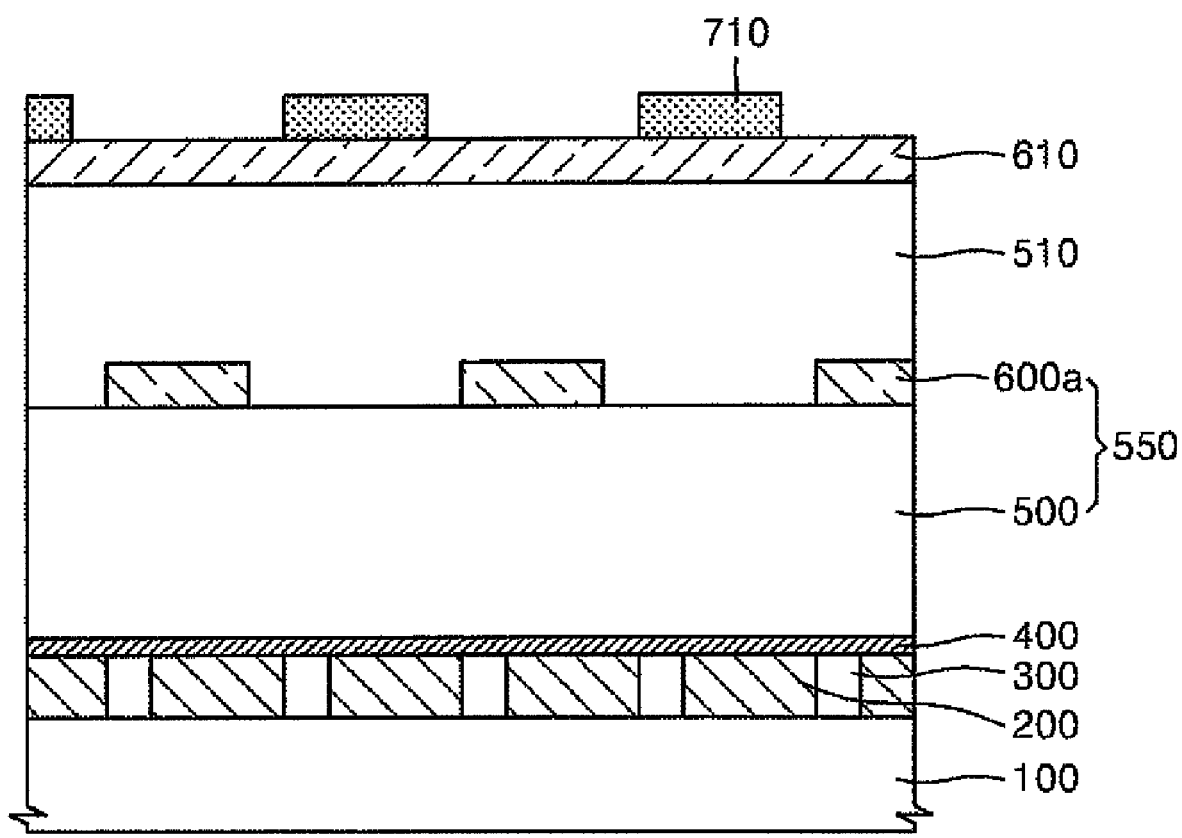

Referring to FIG. 5, a second mold layer 510 is formed over the entire surface of the first support mold layer 550, and a second support layer 610 is formed on the second mold layer 510. The second support layer 610 preferably has a thickness of 100-5000 Å. A second mask 710, e.g., a photoresist pattern, is formed on the second support layer 610. The pattern of the second mask 710 corresponds to that which will be formed in the second support layer 610.

For example, the second mask 710 has a pattern of stripes extending longitudinally in the same direction (the x-direction) as the stripes of the first mask 700. In this case, the stripes of the second mask 710 are disposed over the spaces defined between first supports 600a. Also, the stripes (lines) of the pattern of the second mask 710 are designed such that each stripe will span, widthwise, a second pair of adjacent rows of lower electrodes. As described above, the second pair of adjacent rows of lower electrodes may be located, in the second direction (y direction), between two pairs of the rows of lower electrodes supported by the first supports 600a.

Figure 6A:
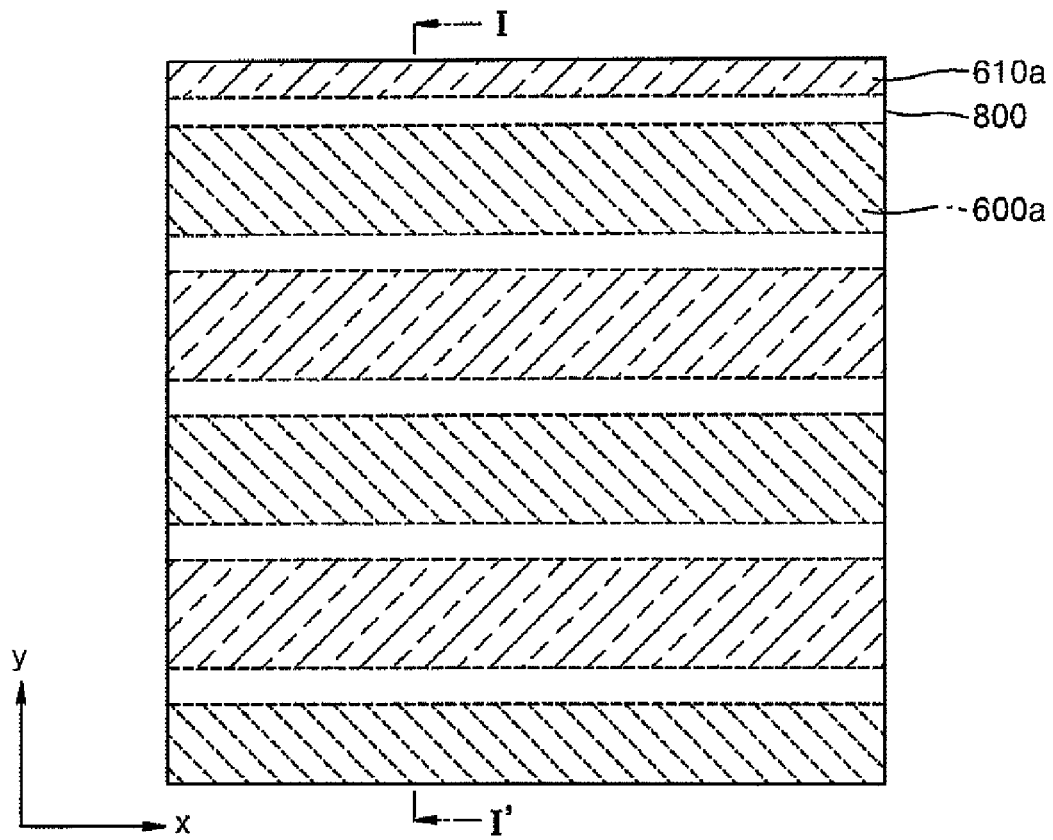
Figure 6B:
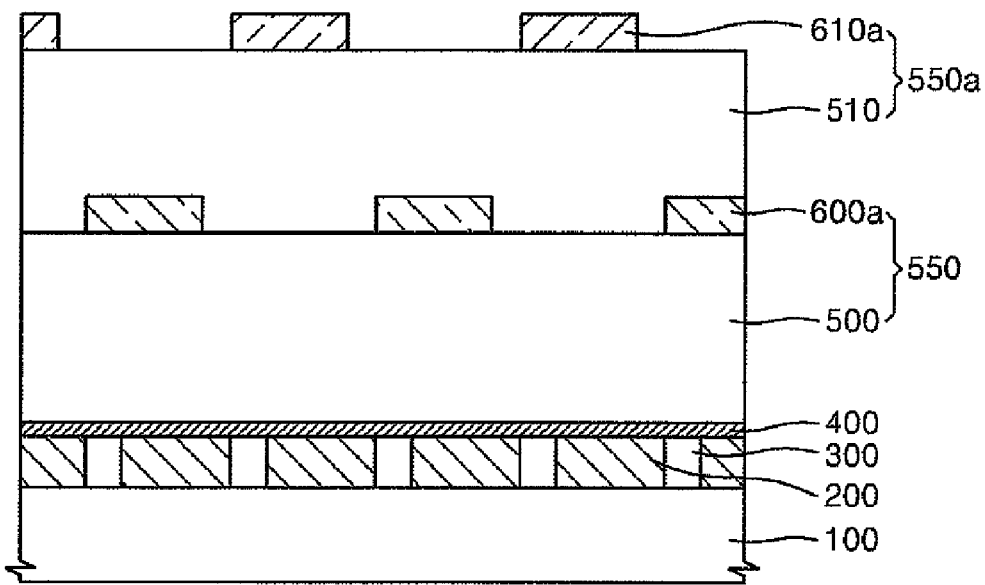

Referring to FIGS. 6A and 6B, the second support layer 610 is dry-etched using the second mask 710 as an etch mask. As a result, second supports 610a in the form of stripes are formed, and the second mold layer 510 is exposed between second supports 610a. Also, at this point, the first supports 600a are respectively located under spaces defined between the second supports 610a. Reference numeral 550a denotes a second support mold layer comprising the second mold layer 510 and the second supports 610a. The second support mold layer 550a is formed on the first support mold layer 500 such that a multi-mold layered structure is realized.

Figure 7A:
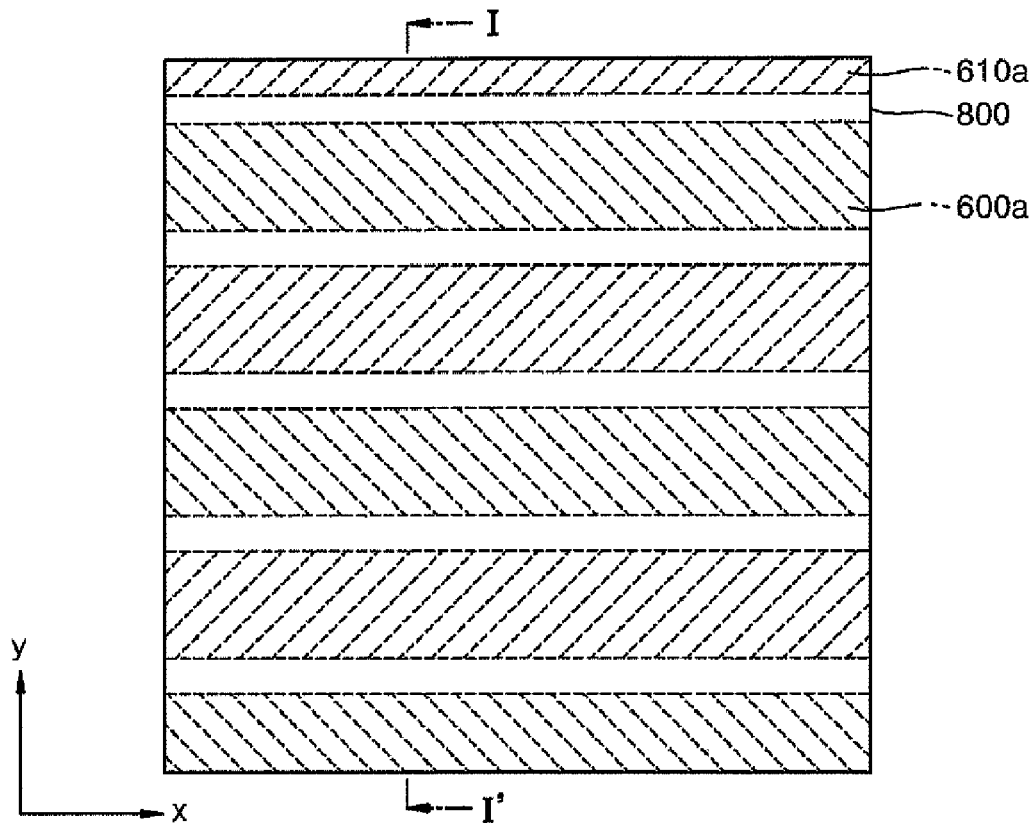
Figure 7B:
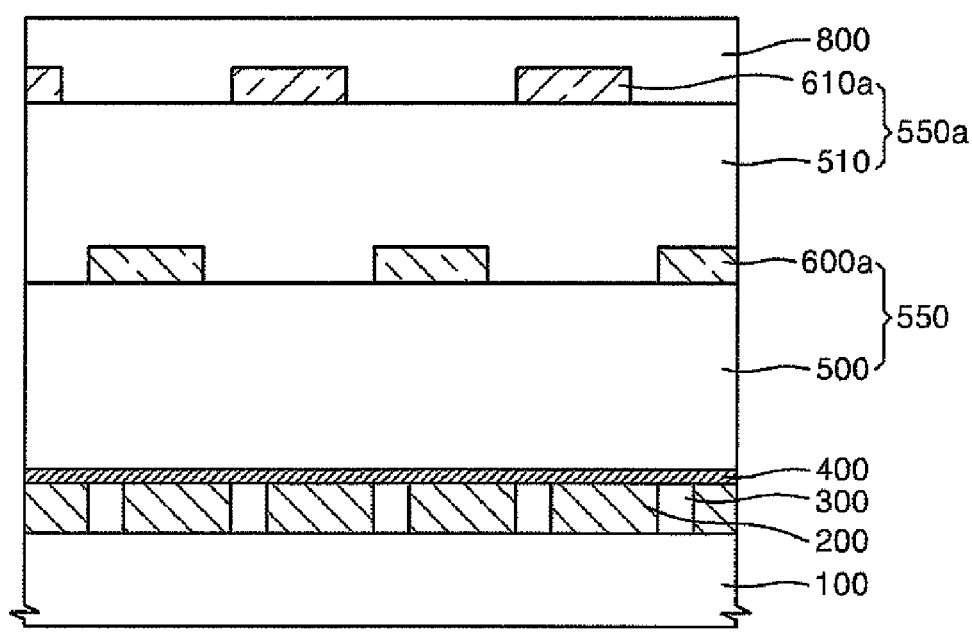

Referring to FIG. 7A and 7B, a protective mold layer 800 is formed on the second support mold layer 550a. The protective mold layer 800 may completely cover the second support layer 610a. For example, the protective mold layer 800 may have a thickness of at least 500 Å. In addition, the sum of the thicknesses of the first and second mold layers 500 and 510 and the protective mold layer 800 is preferably 10,000-40,000 Å.

Figure 8A:
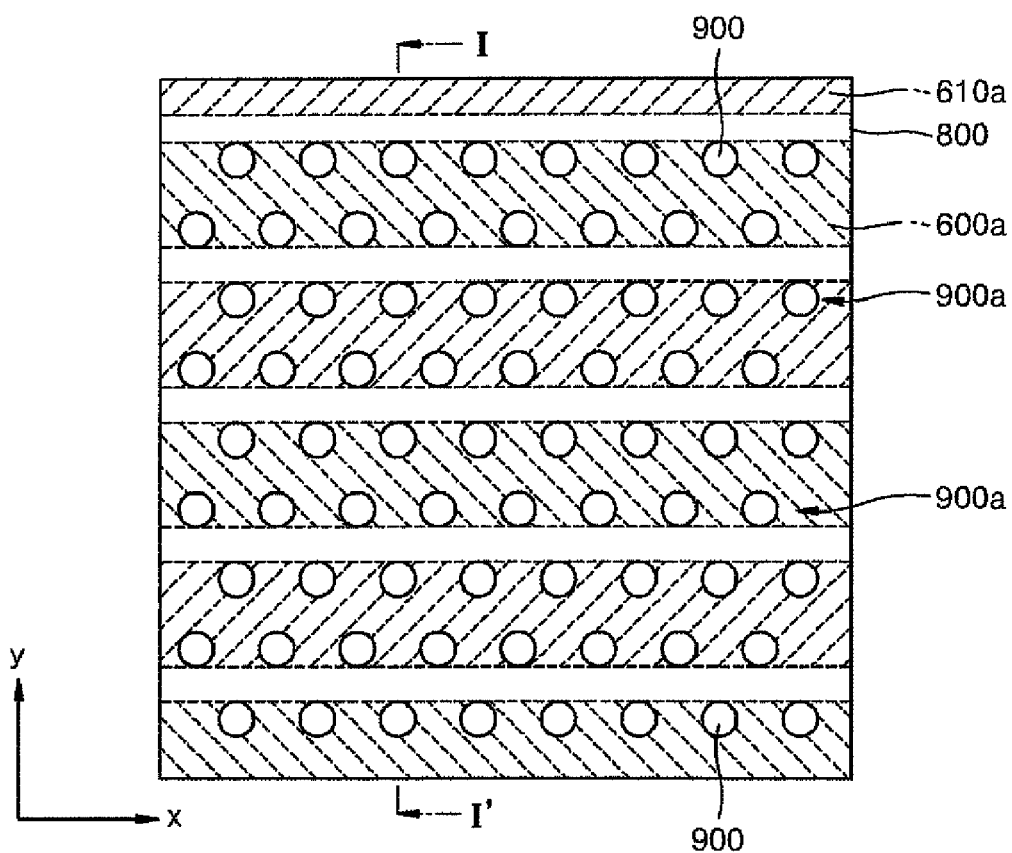
Figure 8B:
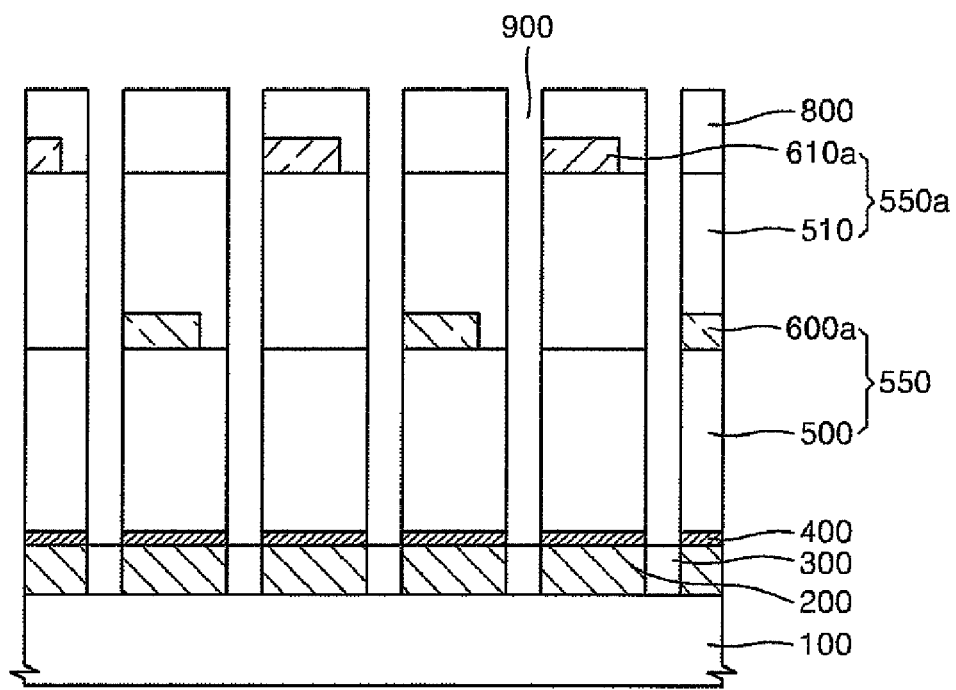

Referring to FIGS. 8A and 8B, the first support mold layer 550, second support mold layer 550a, protective mold layer 800, and anti-etching layer 400 are dry-etched to form a plurality of holes 900 exposing contact plugs 300 in the cell region. The holes 900 define the rows along which the lower electrodes will be formed. That is, rows 900a of holes 900 are formed, with each row extending in the first direction (the x-direction). Note, each row of holes may extend in an oblique direction, i.e., diagonally in a rectangular cell region, as per the example shown in and described with reference to FIG. 1B. To make the best use of space for the lower electrodes, the holes 900 in each row 900a are offset in the second direction from the holes 900 in each row 900a adjacent thereto. Therefore, the holes 900 in adjacent rows 900a are arrayed in a zigzag pattern. Moreover, the holes 900 of every other row 900a (i.e., of alternate rows 900a) are aligned in the second direction (y-direction). In other words, the alternate rows 900a of the holes 900 have groups of lower electrodes aligned in the y-direction.

Each of the supports 600a, 610a left remaining borders the holes 900 in a respective pair of adjacent rows 900a of the holes 900. The holes 900a bordered by each first support 600a are not bordered by any of the second supports 610a. Likewise, the holes 900a bordered by each second support 610a are not bordered by any of the first supports 600a. The pairs of adjacent rows 900a of holes bordered by the first supports 600a are alternately disposed, in the second (y direction), with the pairs of adjacent rows 900a of holes bordered by the second supports 610a.

Figure 9A:
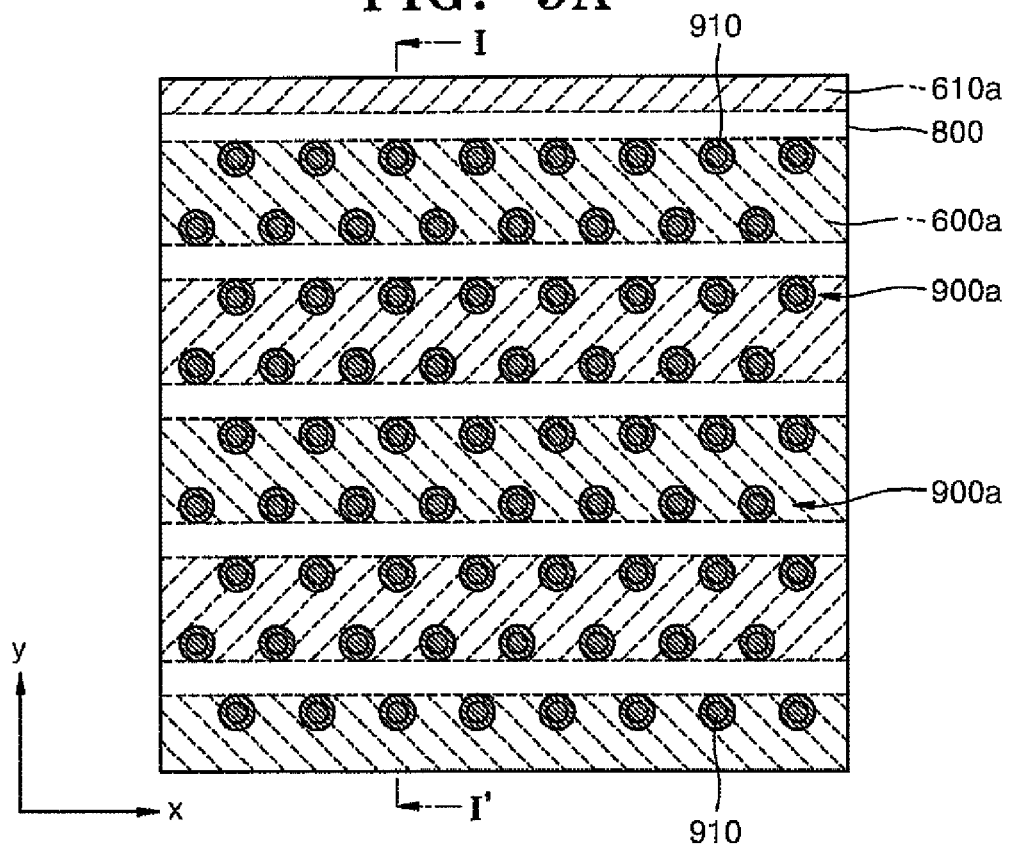
Figure 9B:
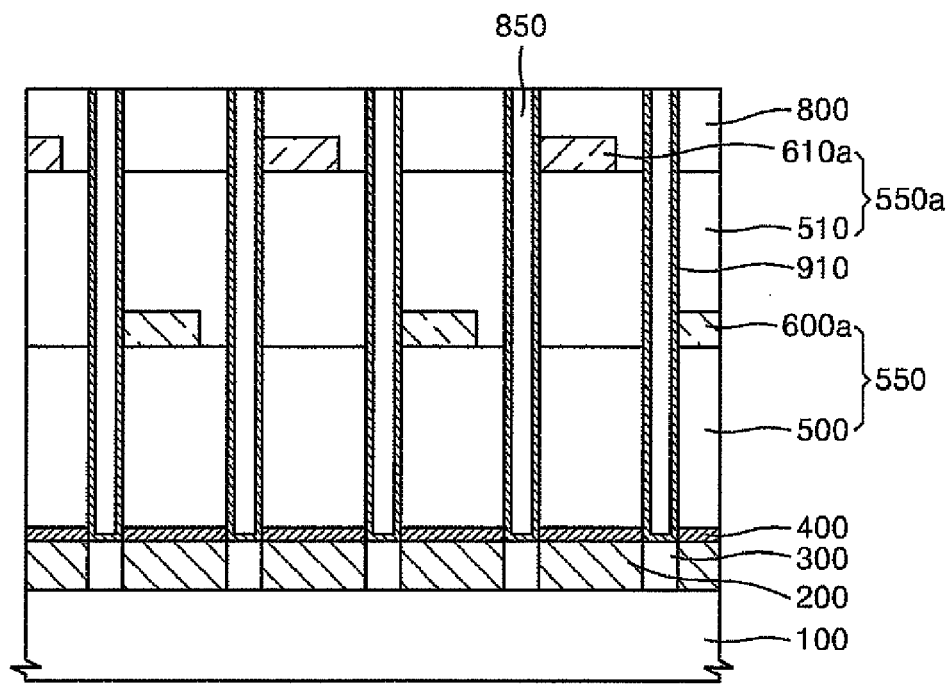

Referring to FIGS. 9A and 9B, conductive material is deposited over the entire surface of the resulting structure on the substrate 100, i.e., on the surfaces defining the holes 900 and on the upper surface of the protective mold layer 800. The conductive material is, for example, polysilicon or titanium nitride. Next, a layer of material is formed over the resulting structure to fill what remains of the holes after the conductive material has been deposited. This buried layer 850 may be of the same material as the first and second mold layers 500 and 510 and the protective mold layer 800 or of a material that has a similar etch rate to the first and second mold layers 500 and 510 and the protective mold layer 800. For example, the buried layer 850 is an oxide layer. The lower electrodes 910 are formed by planarizing the resulting structure using an etch-back and/or chemical mechanical polishing (CMP) process until the protective mold layer 800 is exposed. In this respect, the buried layer 850 may be planarized by an etch-back process, and the underlying conductive material on the protective mold layer 800 may be planarized by a CMP process.

If the protective mold layer 800 were not formed, the supports 610a would have to be formed after the lower electrodes. That is, the second support layer 610 would have to be etched, using a photoresist pattern, to form the striped pattern of the second supports 610 after the electrodes were formed. Non-volatile polymer, such as TiFx, would be produced by the etching process and, along with the photoresist, would flow into the lower electrodes 910. Neither the polymer nor the photoresist could be easily removed from within the lower electrodes. Furthermore, the lower electrodes 910 would be damaged, thereby lowering the capacitance and allowing for leakage current in the final device. However, the method of the present invention, as described above, obviates all of these problems because the second supports 610a are formed before the lower electrodes 910.

Figure 10A:
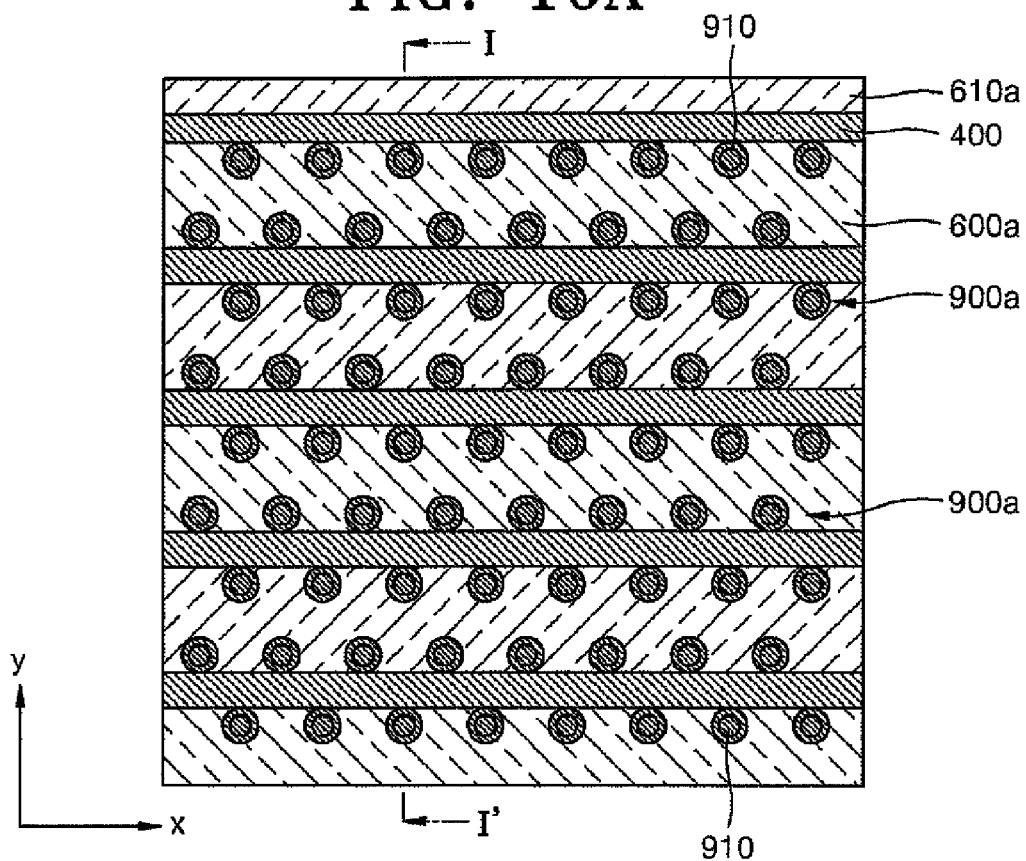
Figure 10B:
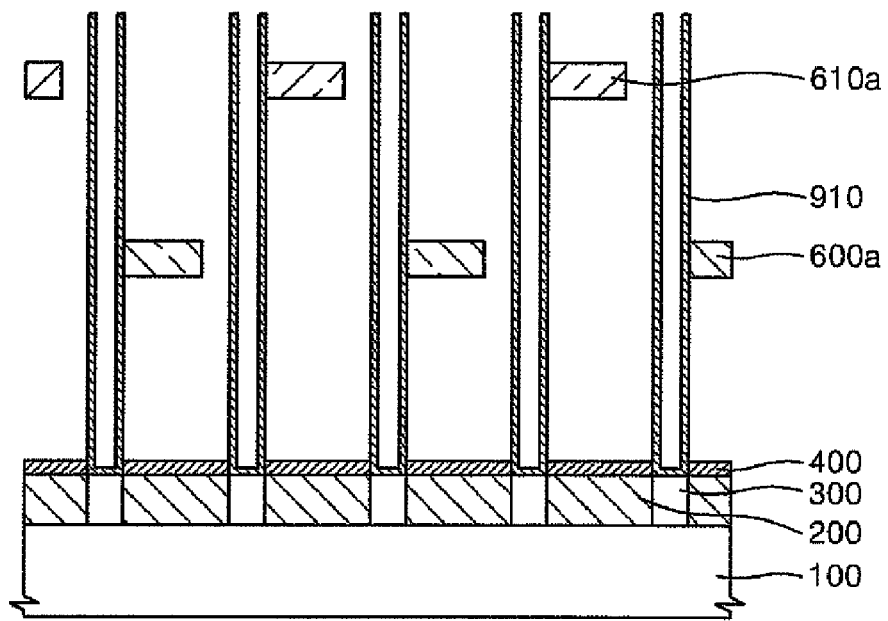

Referring to FIGS. 10A and 10B, the first and second mold layers 500 and 510 and the protective mold layer 800 are removed through a dry-etch process. At this time, the buried layer 850 may be removed together with or independently from the first and second mold layers 500 and 510. The first and second mold layers 500 and 510, the protective mold layer 800, and the buried layer 850 may be removed through a lift-off process using fluorine or limulus amoebocyte lysate (LAL).

In this respect, the first support layer 600, from which first supports 610a are formed, may be of a material that has an etch selectivity with respect to the first mold layer 500. For example, the first support layer 600 is formed of a dielectric etched at a low rate by the LAL used to remove the first mold layer 500. More specifically, the first mold layer 500 may be formed of $SiO_2$, SiGe, Si, or a carbon-based material, and the first support layer 600 may be formed of SiN, SiCn, TaO, or $TiO_2$.

The second mold layer 510 may be of the same material as the first mold layer 500 or otherwise of a material that has an etch rate similar to that of the first mold layer 500. For example, the second mold layer 510 may be of a material etched by LAL at a rate which is different, by 10% or less, from the rate at which the material of the first mold layer 500 is etched by LAL.

The second support layer 610, from which the second supports 610a are formed, may be of a material having an etch rate different from that of the second mold layer 510. For example, the first support layer 600 may be of a material having a dielectric property and etched at a relatively low rate by LAL. That is, the first and second mold layers 500 and 510 may be formed of materials that are etched at a rate different from the rate at which the respective first and second support layers 600 and 610 are etched, with respect to a particular etchant such as LAL. Therefore, the second support layer 610 may be of a material that is identical to that of the first support layer 600 or that has an etch rate similar to that of the first support layer 600. For example, the second mold layer 510 may be $SiO_2$, SiGe, Si, or a carbon-based material, and the second support layer 610 may be SiN, SiCn, TaO, or $TiO_2$.

However, the present invention is not limited to the mold layers and the support layers being composed of these materials.

The protective mold layer 800 may be of the same material as the first and second mold layers 500 and 510 or of a material that has an etch rate similar to each of those of the first and second mold layers 500 and 510. For example, the protective mold layer 800 may be of a material etched by LAL at a rate different, by 10% or less, from the rates at which the first and second mold layers 500 and 510 are etched by LAL. Therefore, as described above, the etch rates of the first and second supports 600a and 610a may be lower than those of the first and second mold layers 500 and 510 and the protective mold layer 800.

Figure 11A:
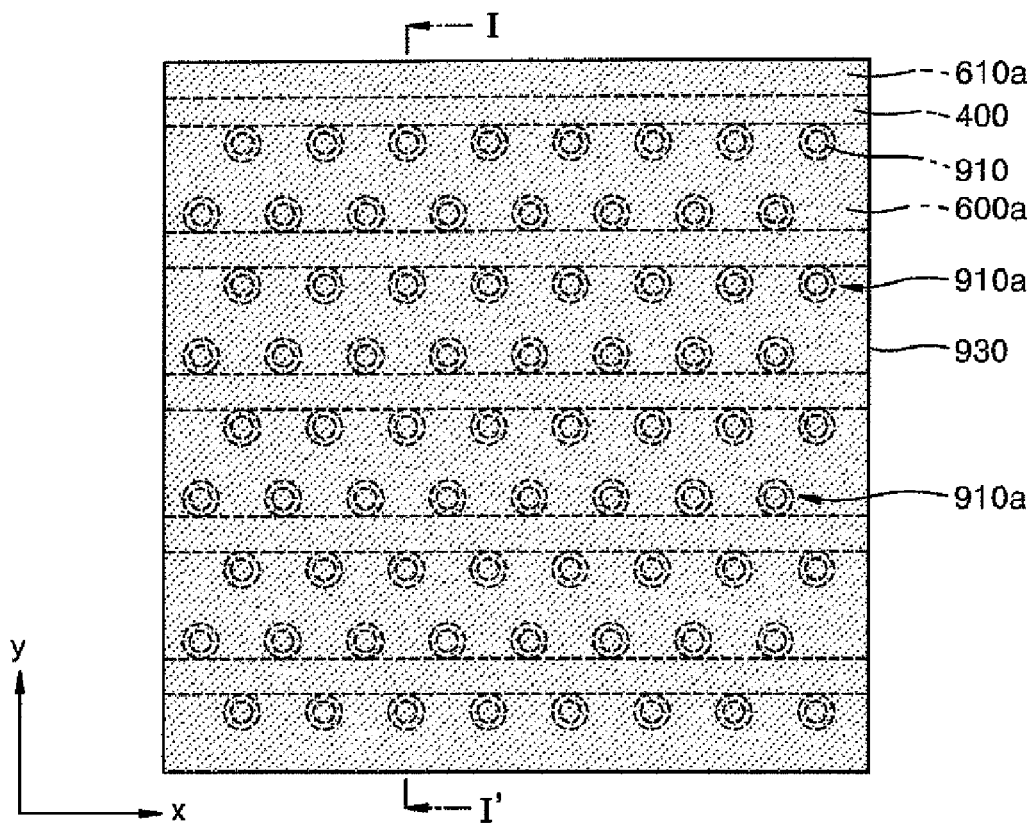
Figure 11B:
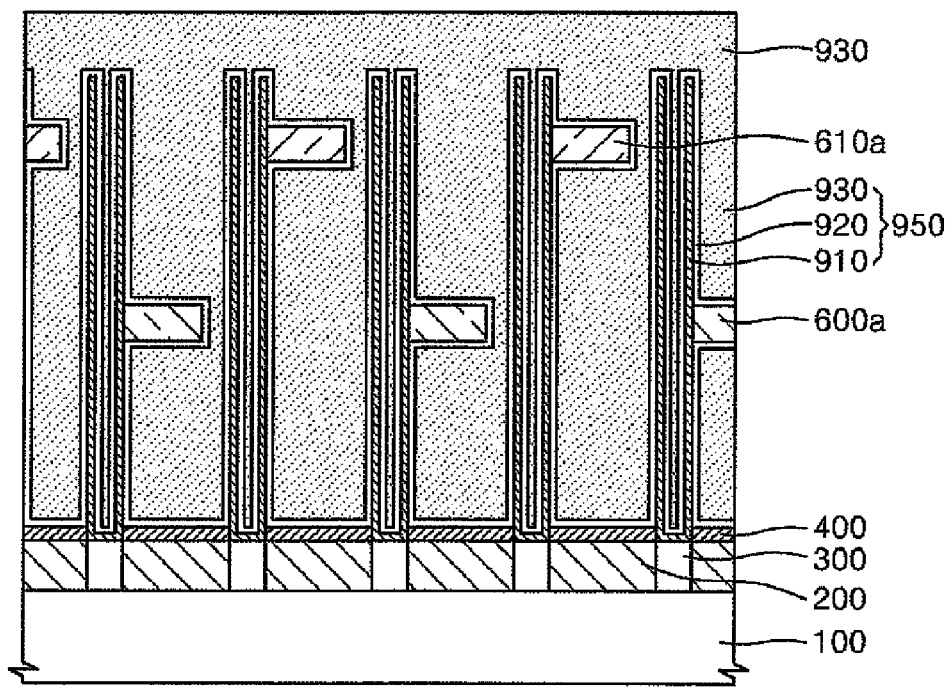

Referring to FIGS. 11A and 11B, a dielectric layer 920 and an upper electrode 930 are formed on the lower electrodes 910 after the first and second mold layers 500 and 510, the protect mold layer 800, and the buried layer 850 have been removed. Thus, cylindrical capacitors 950 are formed.

Figure 12:
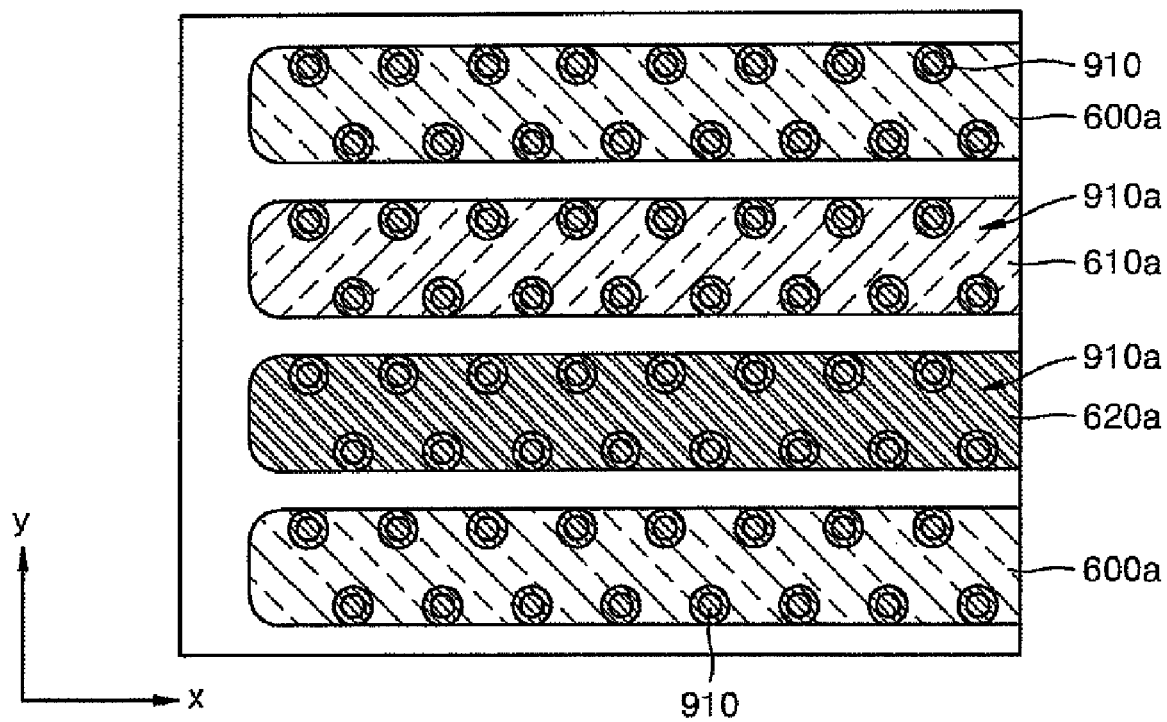
FIG. 12 is a plan view of a semiconductor device having cylindrical capacitors according to the present invention, illustrating yet another form of the lower electrodes and stripe-shaped supports of FIG. 1.

Next, FIG. 12 illustrates another example of an arrangement of lower electrodes and stripe-shaped supports according to the present invention.

Unlike the arrangement shown in FIG. 1, this arrangement includes third supports 620a. A respective pair of adjacent rows 910a of lower electrodes 910 is surrounded and supported by each of the first, second, and third supports 600a, 610a, and 620a. And, the first, second, and third supports 600a, 610a, and 620a are disposed adjacent to each other in the foregoing sequence in the second direction (y direction), and this pattern may be repeated in whole or in part.

In this case, after the second supports 610a are formed, a third mold layer and a third support layer are formed. Subsequently, the third support layer is etched to form the third stripe-shaped supports 620a, i.e., to form a third support mold layer comprising the third mold layer and the third supports. Of course, additional support mold layers may be similarly formed to further support the lower electrodes of the capacitors.

According to the present invention as described above, the supports for the lower electrodes of the capacitors have the form of stripes. Adjacent supports are disposed at different levels within the device so that they may each have a sufficient width. Therefore, the supports may completely surround and thus stably support the lower electrodes. In particular, the present invention ensures that any differences in the size of the holes, in which the lower electrodes are formed, are minimized (which size differences can be caused by differences between the etch rates of the mold layers and the etch rates of the support layers). Therefore, small holes can be prevented from being formed and hence, the present invention can prevent the case in which there are missing capacitors. For similar reasons, the present invention can prevent defective capacitors from being formed and can produce capacitors whose respective capacitances vary by minimal amounts.

In addition, the supports are not formed right at the upper ends of the lower electrodes. Thus, the lower electrodes are not damaged during the fabrication process, photoresist will not flow into the holes in which the lower electrodes are formed, and the fabrication process does not produce polymer which could otherwise also flow into the holes. Therefore, high quality capacitors may be realized according to the present invention.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A semiconductor device comprising:
a substrate on which a cell region and a peripheral circuit region are demarcated;
a plurality of capacitors disposed in the cell region, the capacitors including lower electrodes, a dielectric layer on the lower electrodes, and an upper electrode on the dielectric layer; and
a plurality of supports each engaged with and supporting a respective group of the lower electrodes,
wherein the supports comprise at least one first stripe-shaped support disposed at a level spaced a first distance from the substrate, each first stripe-shaped support extending longitudinally in a first direction, and
at least one second stripe-shaped support disposed at a level spaced a second distance, different from the first distance, from the substrate, each second stripe-shaped support extending longitudinally in the first direction, whereby each stripe-shaped support disposed at one of the levels in the device is spaced from the respective group of lower electrodes which are engaged and supported by each stripe-shaped support disposed at another of the levels in the device,
wherein the lower electrodes are arrayed in a plurality of rows each extending in the first direction, and each of the stripe-shaped supports engages and supports a plurality of adjacent ones of the rows of the lower electrodes, and
wherein the lower electrodes in each of the rows are not aligned, in the second direction, from the lower electrodes in the row adjacent thereto, whereby the lower electrodes of the plurality of adjacent rows supported by each respective one of the supports are arrayed in a zigzag pattern along the first direction.

2. The semiconductor device of claim 1, wherein the at least one first stripe-shaped support comprises a plurality of first stripe-shaped supports each extending longitudinally in the first direction and spaced from each other in a second direction perpendicular to the first direction, and
wherein the at least one second stripe-shaped support comprises a plurality of second stripe-shaped supports each extending longitudinally in the first direction and spaced from each other in the second direction.

3. A semiconductor device comprising:
a substrate on which a cell region and a peripheral circuit region are demarcated;
a plurality of capacitors disposed in the cell region, the capacitors including lower electrodes, a dielectric layer on the lower electrodes, and an upper electrode on the dielectric layer; and
a plurality of supports each engaged with and supporting a respective group of the lower electrodes, wherein at least one of the supports is disposed at a level in the device, with respect to the distance from the substrate, which is different from the level at which at least one of the other supports is disposed, whereby each support disposed at one of the levels in the device is spaced from the respective group of lower electrodes which are engaged and supported by each said support disposed at another of the levels in the device, and wherein among all of the supports that support a group of the lower electrodes in the device at each of said levels, each support disposed at one of the levels is offset from each support disposed at the other of the levels in a direction that is parallel to an upper surface of the substrate and perpendicular to the direction in which the levels are spaced from one another.

4. The semiconductor device of claim 1, wherein the supports comprise a plurality of first stripe-shaped supports disposed at a level spaced a first distance from the substrate, the first stripe-shaped supports extending longitudinally in a first direction and spaced from each other in a second direction perpendicular to the first direction, and a plurality of second stripe-shaped supports disposed at a level spaced a second distance, different from the first distance, from the substrate, the second stripe-shaped supports extending longitudinally in the first direction and spaced from each other in the second direction, wherein each of the plurality of second stripe-shaped supports is offset in the second direction from each of the plurality of first stripe-shaped supports.

5. The semiconductor device of claim 4, wherein the lower electrodes are arrayed in a plurality of rows each extending in the first direction, and each of the stripe-shaped supports engages and supports a plurality of adjacent ones of the rows of the lower electrodes.

6. The semiconductor device of claim 5, wherein the lower electrodes in each of the rows are not aligned, in the second direction, with any of the lower electrodes in the row adjacent thereto, whereby the lower electrodes of the plurality of adjacent rows supported by each respective one of the supports are arrayed in a zigzag pattern along the first direction.

7. A semiconductor device comprising:

a substrate on which a cell region and a peripheral circuit region are demarcated;

a plurality of capacitors disposed in the cell region, the capacitors including a plurality of rows of lower electrodes, each of the rows extending in a common first direction, a dielectric layer on the lower electrodes, and an upper electrode on the dielectric layer; and at least one first stripe-shaped support disposed at a level spaced a first distance from the substrate, each said first stripe-shaped support extending longitudinally in the first direction and engaged with the lower electrodes of a respective first plurality of adjacent ones of the rows of lower electrodes, whereby each said first stripe-shaped support simultaneously supports the lower electrodes of a plurality of adjacent rows of the lower electrodes; and at least one second stripe-shaped support disposed at a level spaced a second distance from the substrate, each said second stripe-shaped support extending longitudinally in the first direction and engaged with the lower electrodes of a respective second plurality of adjacent ones of the rows of lower electrodes, whereby each said second stripe-shaped support simultaneously supports the lower electrodes of a plurality of adjacent rows of the lower electrodes, and wherein the first plurality of rows and the second plurality of rows of lower electrodes are spaced from each other in a second direction perpendicular to the first direction, wherein the first distance between the substrate and the level at which each said at least one first support is disposed is different from the second distance between the substrate and the level at which each said at least one second support is disposed, and wherein among all of the stripe-shaped supports, each at least one first stripe-shaped support is spaced in the second direction from each second stripe-shaped support such that each first stripe-shaped support is spaced in the second direction from the rows of lower electrodes which are engaged and supported by each second stripe-shaped support.

8. The semiconductor device of claim 7, wherein the lower electrodes in each of the rows are not aligned, in the second direction, from the lower electrodes in the row adjacent thereto, whereby the lower electrodes of the plurality of rows supported by each respective one of the supports are arrayed in a zigzag pattern along the first direction.

9. The semiconductor device of claim 7, wherein each of the supports has a thickness of 100-5000 Å.

10. The semiconductor device of claim 7, wherein the lower electrodes have a height of 10000-40000 Å, and the supports are located at levels in the device at least 500 Å beneath upper ends of the lower electrodes.

11. The semiconductor device of claim 7, wherein each of the supports girds all of the electrodes in each of a plurality of adjacent ones of the rows.

12. The semiconductor device of claim 7, wherein the supports extend to an edge of the cell region at a boundary between the cell region and the peripheral circuit region.

13. The semiconductor device of claim 12, wherein said at least one first support comprises a plurality of first supports disposed at the same level in the device, and a segment of the same material as at least two of the first supports is contiguous with the at least two of the first supports and extends along the edge of the cell region to join the at least two of the first supports.

14. The semiconductor device of claim 12, wherein said at least one first support comprises a plurality of first supports disposed at the same level in the device, and a segment of the same material as all of the first supports, disposed at the same level in the device, is contiguous with said all of the first supports and extends along the edge of the cell region to join said all of the first supports.

* * * * *